United States Patent [19]

Fritz

[11] Patent Number: 4,690,275
[45] Date of Patent: Sep. 1, 1987

[54] CARRIER MEMBER FOR INTEGRATED MODULES

[75] Inventor: Otmar Fritz, Neukeferloh, Fed. Rep. of Germany

[73] Assignee: Siemens Aktiengesellschaft, Berlin and Munich, Fed. Rep. of Germany

[21] Appl. No.: 907,793

[22] Filed: Sep. 16, 1986

[30] Foreign Application Priority Data

Sep. 25, 1985 [DE] Fed. Rep. of Germany ... 8527387[U]

[51] Int. Cl.$^4$ ............................................. B65D 73/02
[52] U.S. Cl. ..................................... 206/331; 206/328
[58] Field of Search ........................ 206/331, 328, 334

[56] References Cited

U.S. PATENT DOCUMENTS

| 3,746,157 | 7/1973 | I'Anson | 206/331 |
| 4,556,145 | 12/1985 | Putnam | 206/331 |
| 4,591,053 | 5/1986 | Alemanni | 206/331 |
| 4,615,441 | 10/1986 | Nakamura | 206/331 |

Primary Examiner—Joseph Man-Fu Moy
Attorney, Agent, or Firm—Hill, Van Santen, Steadman & Simpson

[57] ABSTRACT

A carrier member includes a rectangular frame formed by two flanges and two connecting webs around a central recess. A plurality of parallel guide channels for accepting lead wires of an integrated circuit module are provided in the flanges and in the connecting webs wherein the connecting webs have twice as many guide channels as the flanges. Retaining catch tabs are provided on the retaining webs in the central recess so that circuit modules are insertable therein which have lead wires extending from only two opposite sides and, alternately, circuit modules which have lead wires extending in identical numbers from all four sides.

2 Claims, 2 Drawing Figures

CARRIER MEMBER FOR INTEGRATED MODULES

BACKGROUND OF THE INVENTION

1. Field of the Invention

The present invention relates to a carrier member for integrated circuit modules.

2. Description of the Prior Art

There is a risk that integrated circuit modules can have their lead wires easily damaged. Immediately after manufacture, therefore, the integrated circuit modules are inserted into carrier members adapted to the housing shape thereof and to the arrangement of the lead wires. The carrier serves as a packaging, particularly during transport, as well as for manipulating the integrated circuit module during testing and preparation for mounting. Such manipulation can include, for example, cleaning the module, attaching a cooling member, labelling the module, etc. Over and above this, the carrier member offers protection against electrostatic noise influences when it has been formed of an appropriate material or has the proper surface treatment.

In addition to integrated circuit modules having a quadratic or square housings, with lead wires extending in a plane from all four sides, circuit modules are also known having rectangular housings with lead wires extending from only two opposite sides. As a consequence of different housing shapes, the carrier members used for the differently shaped housings deviate from one another in shape and size. Different carrier members are also frequently used for integrated circuit modules having the same housing shape but a different number of terminals extending therefrom. The result is that a separate manufacturing assembly line is required in mounting preparation for every type of carrier member.

SUMMARY OF THE PRESENT INVENTION

An object of the present invention is to provide a universal carrier member for integrated modules that is used for both quadratic as well as rectangular housing shapes so that uniform tools and devices can be used during manufacture and mounting preparation. This and other objects are provided in a carrier member having a rectangular frame around a central recess with parallel guide channels for accepting lead wires of an integrated circuit module. The rectangular frame is formed by two flanges with two connecting webs, the connecting webs having twice as many guide channels as the flanges.

DESCRIPTION OF THE PREFERRED EMBODIMENTS

Figure 1:
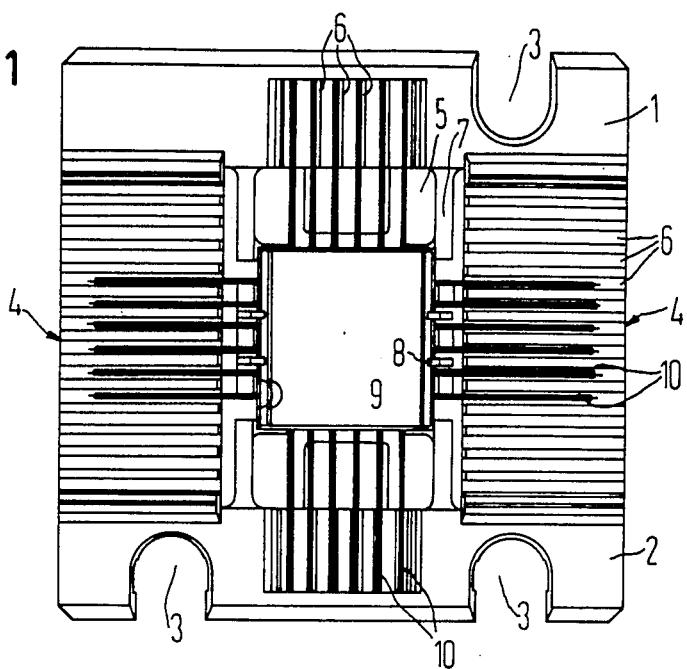
FIG. 1 is a plan view of a carrier member of the present invention in which is mounted an integrated circuit module having a quadratic housing shape.

A carrier member is shown in FIG. 1 formed of two flanges 1 and 2, the flange 1 having one outwardly open groove for accepting a retaining pin (not shown) and the flange 2 having two outwardly open grooves 3 for two accepting retaining pins (likewise not shown). The carrier member also includes two connecting webs 4, which together with the flanges 1 and 2 form a rectangular frame surrounding a central recess 5. The two flanges 1 and 2 and the two connecting webs 4 each have a plurality of parallel extending guide channels 6. Retaining webs 7 are provided in the central recess 5 and are only partially visible in FIG. 1. The retaining web 7, together with retaining tabs or clips 8, serve to hold an integrated circuit module 9 in the central recess. The circuit module 9 illustrated in FIG. 1 has a quadratic housing shape with six lead wires 10 at each of the four housing sides.

Each of the two webs 4 have at least twice as many guide channels 6 as each of the two flanges 1 and 2. Some guide channels 6 in the connecting webs 4 remain unused for the circuit module 9 shown in FIG. 1.

Figure 2:
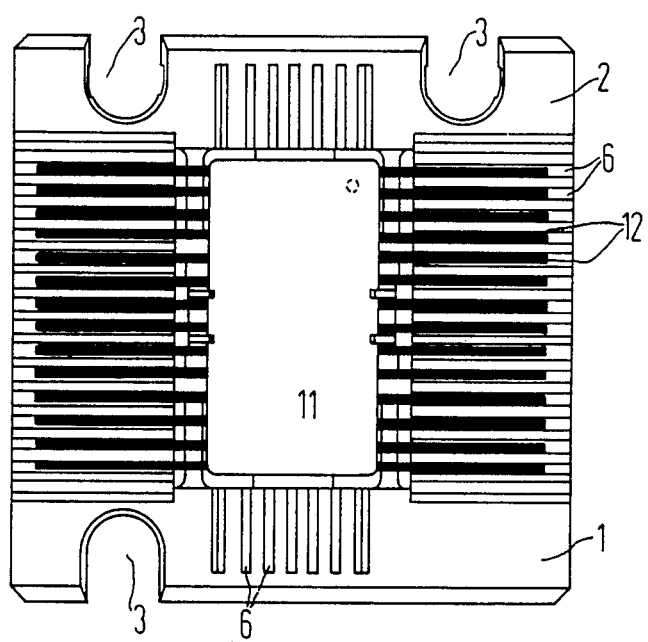
FIG. 2 is a plan view of a carrier member of FIG. 1 in which is mounted an integrated circuit module having a rectangular housing shape.

In FIG. 2, the guide channels 6 in the two connecting webs 4 of the carrier member are fully utilized when an integrated circuit 11 having a rectangular housing shape is placed therein, although this is not necessary. Lead wires 12 are conducted only out of the two long sides of the housing for the module 11. The guide channels 6 in the two flanges 1 and 2 remain unused in this case.

As seen in FIGS. 1 and 2, the universally fashioned carrier member can be used for integrated circuit modules having different housing shapes and different numbers and arrangements of lead wires.

Although modifications and changes may be suggested by those skilled in the art, it is the intention of the inventor to embody within the patent warranted hereon all changes and modifications as reasonably and properly come within the scope of his contribution to the art.

I CLAIM AS MY INVENTION:

1. A carrier member for integrated circuit modules, comprising:

two parallel flanges each having at least one outwardly open groove for accepting a retaining pin;

two connecting webs extending between said two parallel flanges to form a rectangular frame around a central recess;

a plurality of parallel extending guide channels for accepting lead wires extending laterally from the integrated circuit module and provided in each of said flanges and said connecting webs, at least twice as many of said guide channels in said connecting webs as in said flanges;

retaining webs arranged in said central recess; and retaining catch tabs arranged in said central recess;

whereby circuit modules having lead wires extending only from two opposite sides occupy all guide channels of said connecting webs, and circuit modules having lead wires extending in identical numbers from all four sides are insertable into said central recess.

2. A carrier member for holding integrated circuit modules having lead wires, comprising:

a rectangular frame around a central recess, said rectangular frame including first and second parallel flanges and first and second parallel connecting webs extending between respective opposite ends of said first and second flanges;

means for establishing a predetermined alignment of said frame;

guide channels formed in said flanges and in said connecting webs for accepting the lead wires of the integrated module, said connecting webs having at least twice as many of said guide channels as said flanges; and means for holding the integrated module in said central recess;
whereby square integrated modules having lead wires projecting in a plane from all four sides are fastenable in said carrier member, and rectangular integrated modules having lead wires projecting in a plane from two opposite sides are alternately fastenable in the same carrier member.

* * * * *